(12) United States Patent
Morita et al.

(10) Patent No.: US 7,420,439 B2
(45) Date of Patent: Sep. 2, 2008

(54) MICRO-RESONATOR, BAND-PASS FILTER, SEMICONDUCTOR DEVICE AND COMMUNICATION APPARATUS

(75) Inventors: Shinya Morita, Kanagawa (JP); Takashi Kinoshita, Kanagawa (JP); Shun Mitarai, Kanagawa (JP)

(73) Assignee: Sony Corporation, Tokyo (JP)

( * ) Notice: Subject to any disclaimer, the term of this patent is extended or adjusted under 35 U.S.C. 154(b) by 310 days.

(21) Appl. No.: 11/344,842

(22) Filed: Jan. 31, 2006

(65) Prior Publication Data

US 2006/0176125 A1 Aug. 10, 2006

(30) Foreign Application Priority Data

Feb. 8, 2005 (JP) ............................. P2005-032084

(51) Int. Cl.
*H03H 9/00* (2006.01)

(52) U.S. Cl. ........................................ 333/186; 333/197

(58) Field of Classification Search ................. 333/186
See application file for complete search history.

(56) References Cited

U.S. PATENT DOCUMENTS 4,625,184 A * 11/1986 Niitsuma et al. ............. 333/150

| | | | |
|---|---|---|---|
| 2002/0163403 A1* | 11/2002 | Sawada et al. | 333/195 |
| 2003/0184412 A1* | 10/2003 | Gorrell | 333/186 |
| 2007/0052497 A1* | 3/2007 | Tada | 333/186 |
| 2007/0171001 A1* | 7/2007 | Naniwada et al. | 333/186 |

OTHER PUBLICATIONS

C. T-Nguyen, Micromechanical components for miniaturized low-power communications (invited plenary), proceedings, 1999 IEEE MTT-S International Microwave Symposium RF MEMS Workshop, Jun. 18, 1999, pp. 48-77.

* cited by examiner

*Primary Examiner*—Benny Lee
*Assistant Examiner*—Eric R Hamill
(74) *Attorney, Agent, or Firm*—Bell, Boyd & Lloyd LLP

(57) ABSTRACT

A micro-resonator of a single structure which outputs signals of two resonance frequencies of mutually opposite phases and in which different resonance frequencies are adjusted independently is provided. The micro-resonator includes: an oscillation portion 6 sustained with a gap by support portions 8 [8A, 8B] and an input electrode 3 and an output electrode 4 that become lower electrodes facing the oscillation portion 6 across the gap, in which the input electrode 3 and the output electrode 4 are disposed to face each other along a line intersecting the oscillation portion 6, the oscillation portion 6 generates torsional oscillation and flexural oscillation, and output signals of two resonance frequencies close to each other based on different resonance modes have mutually different phases by 180°.

7 Claims, 7 Drawing Sheets

MICRO-RESONATOR, BAND-PASS FILTER, SEMICONDUCTOR DEVICE AND COMMUNICATION APPARATUS

CROSS REFERENCES TO RELATED INVENTIONS

The present application claims priority to Japanese Patent Application 2005-032084 filed in the Japanese Patent Office on Feb. 8, 2005, the entire contents of which are incorporated herein by reference.

BACKGROUND

The present application relates to a micro-resonator, a band-pass filter using the micro-resonator, a semiconductor device including the micro-resonator, and a communication apparatus using a band-pass filter including the micro-resonator.

Wireless communication technology has greatly advanced in recent years, and there has been a demand for size and weight reduction in a communication apparatus using the wireless communication technology. Micro electro mechanical system (MEMS) technology to manufacture a micro mechanical structure by using micro-processing technology used for a semiconductor has been used in an RF (high frequency) signal processing portion where size reduction has been a longstanding issue. For example, there is a mechanical filter using mechanical resonance, which is small in size and is capable of being integrated, and so it is expected to be applied to a communication field. Use of such a MEMS element as an RF filter has been proposed by research institutes including Michigan University (see, C. T-Nguyen, Micromechanical components for miniaturized low-power communications (invited plenary), proceedings, 1999 IEEE MTT-S International Microwave Symposium RF MEMS Workshop, Jun. 18, 1999, pp. 48-77).

A resonance characteristic of a resonator in a mechanical filter has an asymmetrical form having a resonance peak and an anti-resonance peak. When such resonance characteristics are combined to manufacture a band-pass filter, a plurality of resonators each having a different resonance frequency or a peripheral circuit to change the phase of a signal are needed. Because of the above, the whole area becomes large and a small-sized filter may not be obtained. When a higher harmonic wave is used, two signals of opposite phases can be obtained in one resonator, however, respective frequencies may not be adjusted independently in that case.

SUMMARY

In view of the above, embodiments of the present invention provides a micro-resonator of a single structure which can output signals of two resonance frequencies of mutually opposite phases and in which different resonance frequencies can be independently adjusted.

Further, according to an embodiment, a band-pass filter using the above micro-resonator, a semiconductor device including the micro-resonator and a communication apparatus including the micro-resonator as a signal filter is provided.

A micro-resonator according to an embodiment is formed of a single structure, having two resonance frequencies close to each other and based on different resonance modes, in which output signals of the two resonance frequencies have mutually different phases by 180°.

It is preferable that the micro-resonator according to an embodiment includes: an oscillation portion sustained with a gap by one or a plurality of support portions and an input electrode and an output electrode that become lower electrodes facing the oscillation portion across the gap, the input electrode and the output electrode are disposed to face each other along a line intersecting the oscillation portion, and the oscillation portion generates torsional oscillation and flexural oscillation.

It is preferable that the micro-resonator according to an embodiment is one in which the oscillation portion generates the flexural oscillation with the two support portions as nodes and the torsional oscillation with a line connecting the two support portions as an axis.

It is further preferable that the oscillation portion has blade portions receiving electrostatic power from the lower electrodes on both sides of a portion that becomes a torsional axis on the line connecting the two support portions.

It is further preferable that the support portions, oscillation portion, and lower electrodes are made of polycrystalline silicon.

A band-pass filter according to an embodiment includes any of the above-described micro-resonators.

A semiconductor device according to an embodiment includes any of the above-described micro-resonators.

A communication apparatus according to an embodiment is a communication apparatus provided with a filter to limit the band of a transmission signal and/or reception signal and uses a filter including any of the above-described micro-resonators as the filter.

According to the embodiment, a micro-resonator can be provided in which two oscillation modes are used to obtain two different resonance frequencies in a single structure. Because the different oscillation modes are generated, the two resonance frequencies can be adjusted independently. Accordingly, the micro-resonator is suitable to be applied to a band-pass filter of a required bandwidth.

Because the micro-resonator includes: the oscillation portion sustained with a gap by one or the plurality of support portions and the input electrode and the output electrode that become the lower electrodes facing the oscillation portion across the gap; the input and output electrodes are disposed to face each other along the line intersecting the oscillation portion; and the oscillation portion generates the torsional oscillation and the flexural oscillation, the micro-resonator capable of independently controlling two resonance frequencies in the single structure can be provided.

Because the blade portions are provided on both sides of a portion that becomes the torsional axis in the oscillation portion, the torsional oscillation and the flexural oscillation can be generated.

According to an embodiment, because the above-described micro-resonator is used, the band-pass filter in which a bandwidth can arbitrarily be changed and a central frequency can arbitrarily be set is provided.

According to an embodiment, because the above-described micro-resonator is used as a resonator constituting the semiconductor device, the semiconductor device having the small-sized resonator occupies a small area, has an excellent characteristic and high reliability can be provided.

According to an embodiment, because the filter including the micro-resonator is used as the band-pass filter, the highly reliable communication apparatus can be obtained having a small-sized band filter occupies a small area and an excellent filter characteristic is obtained.

Additional features and advantages are described herein, and will be apparent from, the following Detailed Description and the figures.

DETAILED DESCRIPTION

Hereinafter, an embodiment is explained by referring to the accompanied drawings.

Figure 1:
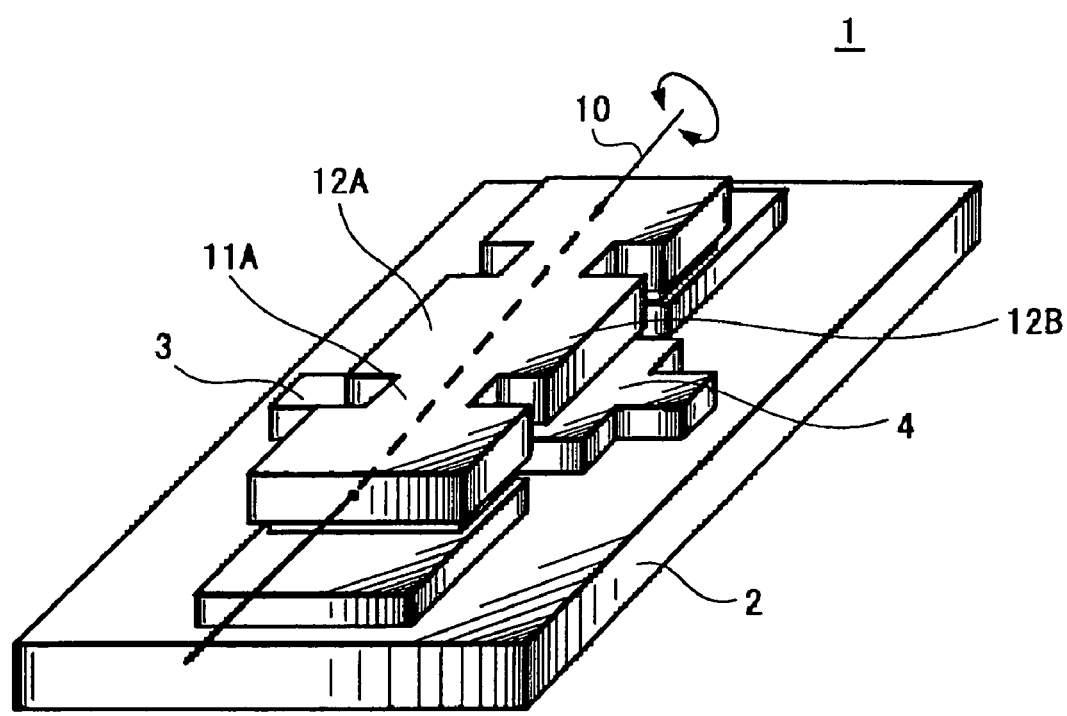
FIG. 1 is a perspective view showing a micro-resonator according to an embodiment.
Figure 2:
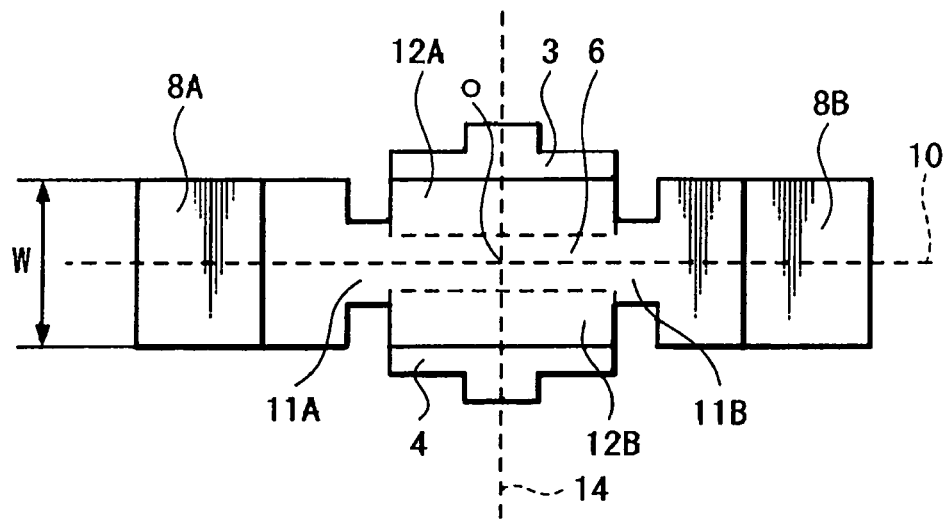
FIG. 2 is a top view showing a micro-resonator according to an embodiment.
Figure 3:
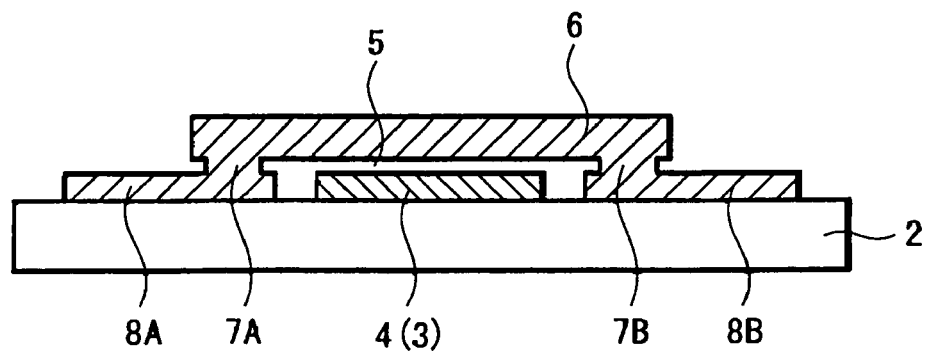
FIG. 3 is a side view showing a micro-resonator according to an embodiment.

FIGS. 1 through 3 show a micro-resonator according to an embodiment. A micro-resonator in this embodiment is an element of micro-scale and nano-scale. Here, FIG. 1 is a perspective view showing this embodiment, FIG. 2 is a top view thereof, and FIG. 3 is a side view thereof.

As shown in FIGS. 1 through 3, a micro-resonator 1 according to this embodiment includes: an input electrode 3 and an output electrode 4 that become lower electrodes formed on a substrate 2 such as a semiconductor substrate whose surface is covered with an insulation film or an insulating substrate and a beam 6 that becomes an oscillation portion provided to face those input electrode 3 and output electrode 4 across a gap of micro-height (what is called micro space) 5. Both ends of this beam, that is, of the oscillation portion 6 are connected through support portions 7 [7A, 7B] to electrodes 8 [8A, 8B] formed on the substrate 2. The oscillation portion 6 has a symmetrical shape with respect to an axis line 10 through the center O in the width direction connecting both support portions 7A and 7B, and constricted portions 11 [11A, 11B] of a required width A and a required length B are formed in the vicinity of the support portions 7A and 7B to thereby form blade portions 12 [12A, 12B] on both sides of the center of the oscillation portion with this constricted portions 11.

On the other hand, the input electrode 3 and the output electrode 4 are disposed to face each other on an axis line 14 through the center O of the oscillation portion 6 and intersecting (in this embodiment perpendicular to) the axis line 10. In this case, the input electrode 3 and the output electrode 4 are disposed correspondingly to the respective blade portions 12A and 12B of the oscillation portion 6. Specifically, the input electrode 3 is disposed under the blade portion 12A on one side of the oscillation portion 6 to enter further inward from the blade portion somewhat toward the axis line 10. Further, the output electrode 4 is formed under the blade portion 12B on the other side of the oscillation portion 6 to enter further inward from the blade portion somewhat toward the axis line 10.

Next, an operation of the micro-resonator 1 of this embodiment is explained. A required direct-current bias voltage (hereinafter, referred to as a DC bias voltage) is applied to the oscillation portion 6. When a required frequency signal is input into the input electrode 3, the oscillation portion 6 resonates by electrostatic power generated between the input electrode 3 and the oscillation portion 6 to which the DC bias voltage is applied, and a required frequency signal is output from the output electrode 4. Hereupon, the oscillation portion 6 is oscillated in two different oscillation modes.

Specifically, a first oscillation mode is the mode in which the blade portion 12A of the oscillation portion 6 separated by the micro-space 5 is oscillated by an electrostatic drive with the signal input into the input electrode 3. Since both ends of the oscillation portion 6 are fixed by the support portions 7A and 7B, the blade portions 12A and 12B oscillate to be twisted around the axis line 10 as the center at the constricted portions 11A and 11B at this time, that is, what is called torsional oscillation occurs. Hence, the signal is transmitted to the output electrode 4 through the blade portion 12B to function as a resonator. A second oscillation mode is what is called flexural oscillation in which the oscillation portion 6 including the blade portions 12A and 12B oscillates around the support portions 7A and 7B as the nodes by the signal input into the input electrode 3.

Therefore, the micro-resonator 1 according to this embodiment functions as a resonator that has two resonance frequencies generated by the torsional oscillation and flexural oscillation. Here, when changing the size of each portion of the oscillation portion 6, the two resonance frequencies can be changed independently.

Figure 4:
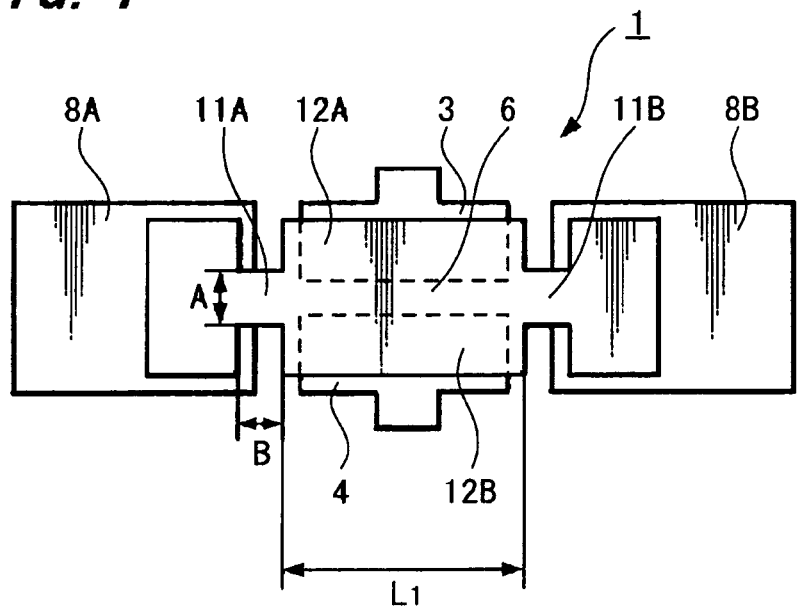
FIG. 4 is a model diagram provided for the explanation of independently controlling two resonance frequencies according to an embodiment.
Figure 5:
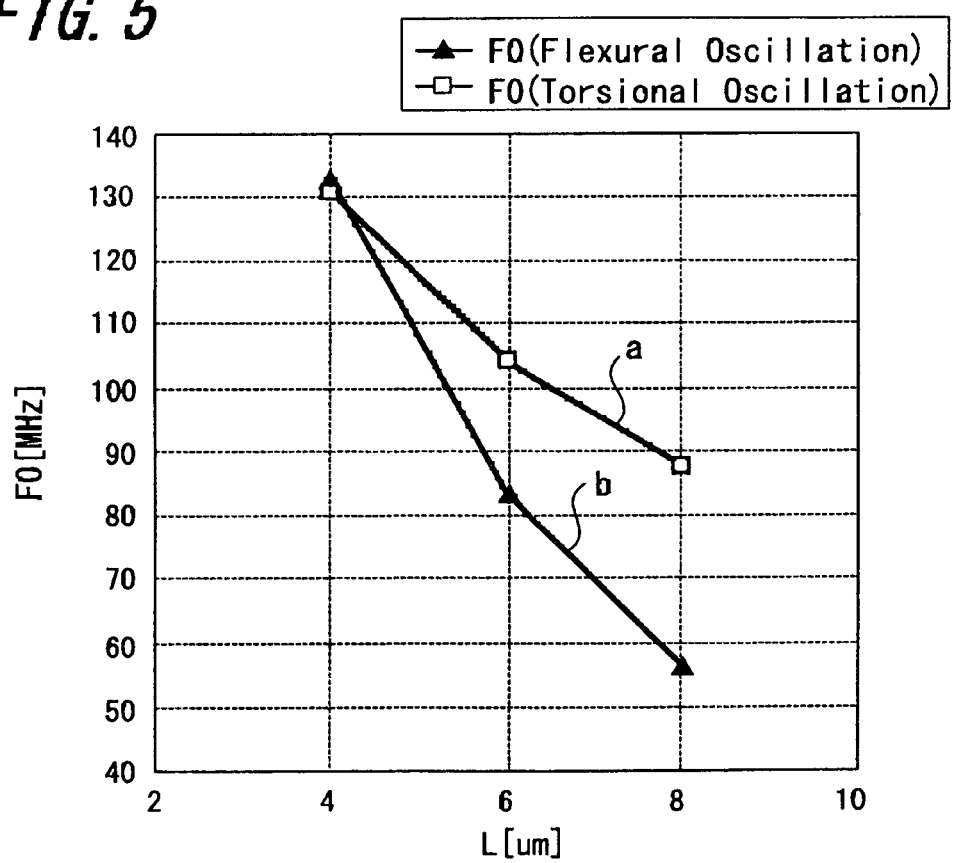
FIG. 5 is a graph showing a calculation result based on a simulation of each resonance frequency when a length L1 of an oscillation portion is changed in a micro-resonator according to an embodiment.

FIG. 5 shows a calculation result based on a simulation of each resonance frequency of the torsional oscillation and the flexural oscillation in the micro-resonator 1 of FIG. 4 when a width of the oscillation portion 6 is 3 μm, a width A and a length B of the constricted portions 11A and 11B are 1 μm respectively, and a length L1 of the blade portions 12A and 12B is changed. In FIG. 5, curve a shows the torsional oscillation and curve b shows the flexural oscillation. A difference between the resonance frequencies can arbitrarily be adjusted to be the torsional oscillation or flexural oscillation by changing the length L1 of the blade portions 12A and 12B.

Further, two resonance frequencies can be shifted to a high frequency side and a low frequency side by changing a thickness of the blade portions 12A and 12B.

In the micro-resonator of this embodiment, the following is conceivable. When the width A and the length B of the constricted portions 11A and 11B are fixed and the length L1 of the blade portions 12A and 12B increases in FIG. 4, a spring constant with respect to torsional displacement with the support portions 7A and 7B as fulcrums becomes small and the resonance frequency of the torsional oscillation becomes low. Similarly, a spring constant with respect to flexural displacement becomes small in the flexural oscillation and the resonance frequency of the flexural oscillation becomes low.

On the contrary, when the width A and the length B of the constricted portions 11A and 11B are fixed and the length L1 of the blade portions 12A and 12B is reduced, the spring constant with respect to the torsional displacement with the support portions 7A and 7B as the fulcrums becomes large and the resonance frequency of the torsional oscillation becomes high. Similarly, the spring constant with respect to the flexural displacement becomes large in the flexural oscillation and the resonance frequency of the flexural oscillation becomes high.

When the length L1 of the blade portions 12A, 12B and the length B of the constricted portions 11A, 11B are fixed and the width A of the constricted portions 11A, 11B are increased, the spring constant with respect to the torsional displacement becomes large and the resonance frequency generated by the torsional oscillation becomes high. Similarly, the spring constant with respect to the flexural displacement becomes large in the flexural oscillation and the resonance frequency of the flexural oscillation becomes high.

On the contrary, when the length L1 of the blade portions 12A, 12B and the length B of the constricted portions 11A, 11B are fixed and the width A of the constricted portions 11A, 11B is reduced, the spring constant with respect to the torsional displacement becomes small and the resonance frequency generated by the torsional oscillation becomes low. Similarly, the spring constant with respect to the flexural displacement becomes small in the flexural oscillation and the resonance frequency of the flexural oscillation becomes low.

Figure 6:
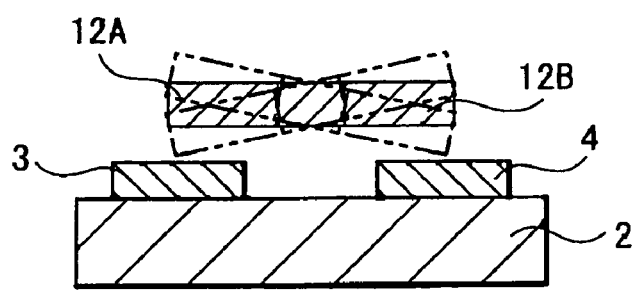
FIG. 6 is an explanatory diagram provided for the explanation of one oscillation mode in a micro-resonator according to an embodiment.
Figure 7:
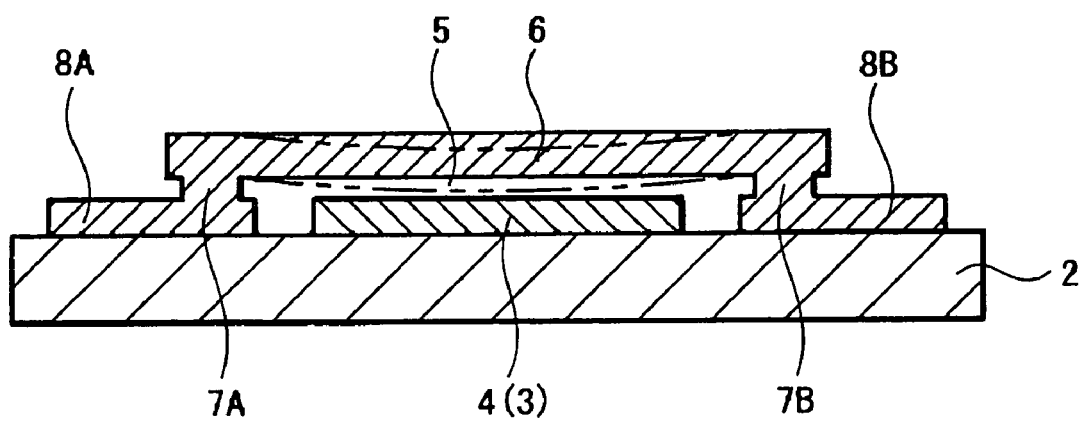
FIG. 7 is an explanatory diagram provided for the explanation of the other oscillation mode in the micro-resonator according to the embodiment.

In the above-described micro-resonator 1 of this embodiment, the phase of the signal transmitted by the torsional oscillation is different by 180° from that of the signal transmitted by the flexural oscillation. Specifically, as shown in FIG. 6, since the blade portions oscillate to turn around the axis line 10 as the center at the constricted portions 11A and 11B in the torsional oscillation, when the blade portion 12A moves away from the input electrode 3, the blade portion 12B comes close to the output electrode 4 and when the blade portion 12A comes close to the input electrode 3, the blade portion 12B moves away from the output electrode 4 and a phase of an output signal becomes opposite to that of an input signal. On the other hand, in the flexural oscillation as shown in FIG. 7, when the oscillation portion 6 comes close to the input electrode 3, the portion also comes close to the output electrode 4; and when the oscillation portion 6 moves away from the input electrode 3, the portion also moves away from the output electrode 4 and a phase of an output signal becomes the same as that of an input signal.

Figure 8A:
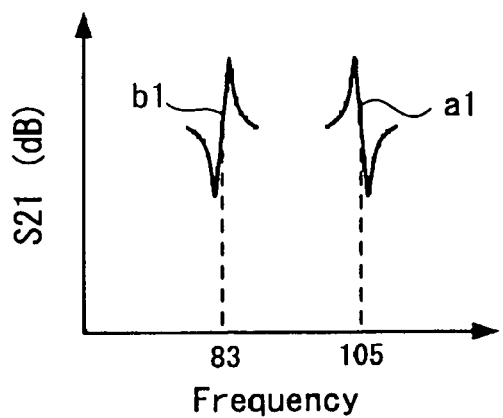
FIGS. 8A and 8B are explanatory diagrams showing a filter characteristic when a micro-resonator according to an embodiment of the present invention is applied to a band-pass filter.
Figure 8B:
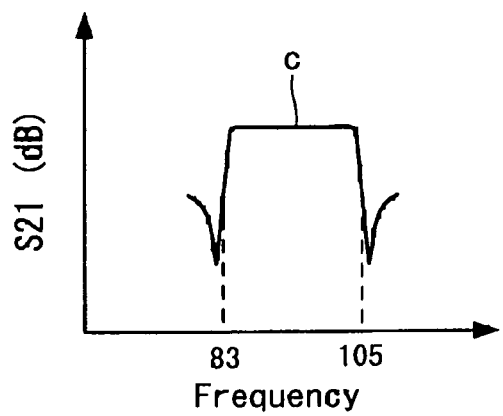
Figure 9:
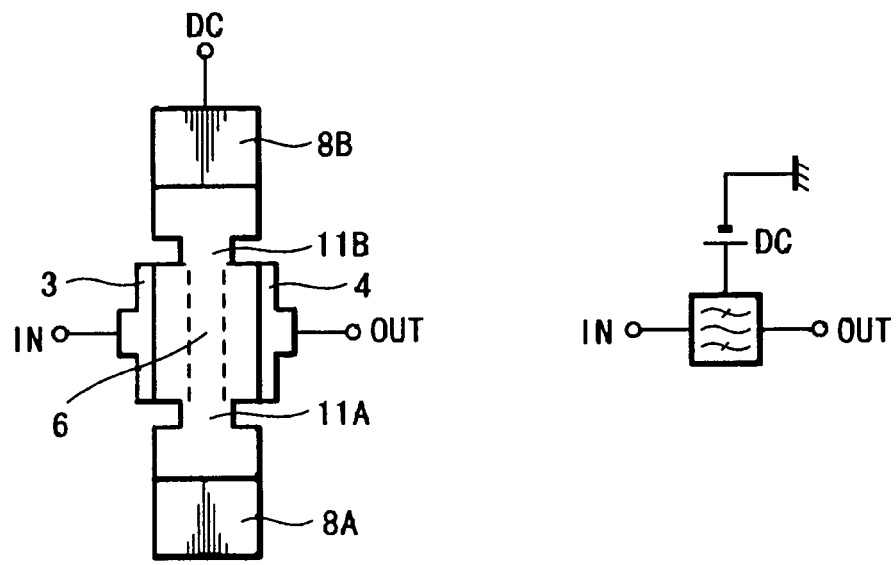
FIG. 9 is a circuit diagram of a band-pass filter including a micro-resonator according to an embodiment.

Since the phase of the signal transmitted by the torsional oscillation is different from the phase of the signal transmitted by the flexural oscillation by 180°, the micro-resonator 1 of this embodiment is capable of functioning as a band-pass filter by making two resonance peaks close to each other. Specifically, as shown in FIGS. 8A and 8B (and FIG. 5), a resonance characteristic b1 of the flexural oscillation and a resonance characteristic a1 of the torsional oscillation which has the phase opposite to the characteristic b1 can be obtained (refer to FIG. 8A) from one micro-resonator 1, and with these two resonance peaks (central frequencies) being set close to each other, a band-pass filter having a signal transmitting characteristic of a required bandwidth, that is, a filter characteristic c can be obtained, as shown in FIG. 8B. FIG. 9 shows a circuit diagram of a band-pass filter using the above micro-resonator 1. Although the central frequency of 130 MHz is described in the example of FIGS. 4 and 5, the central frequency and bandwidth can variably be designed by changing the width, length, and thickness of the oscillation portion 6.

Next, an embodiment of a method for manufacturing the above-described micro-resonator 1 is explained by referring to FIGS. 10A to 10E.

Figure 10A:
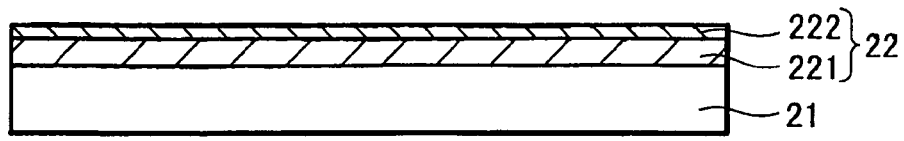
FIGS. 10A through 10E are manufacturing process diagrams showing a method of manufacturing a micro-resonator according to an embodiment.

First, as shown in FIG. 10A, an insulation film 22 is formed on an upper surface of a high resistance silicon substrate 21. In this embodiment, the insulation film 22 is formed of a composite film including a silicon oxide film (SiO2 film) 221 formed by decompression CVD and a silicon nitride film (SiN film) 222 formed by plasma CVD.

Figure 10B:
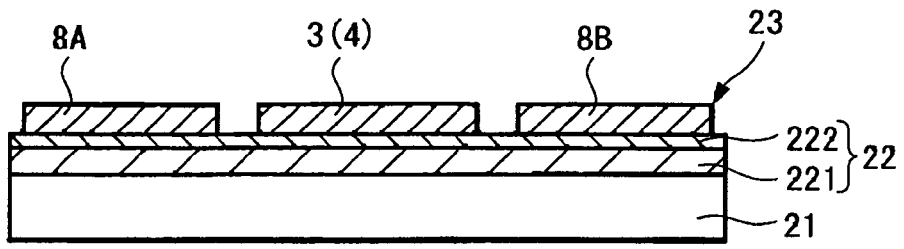

Next, as shown in FIG. 10B, a conductive film, which is a polycrystalline silicon layer 23 doped with impurities in high concentrations in this embodiment, is formed on the insulation film 22 by the decompression CVD. Then, patterning is performed on the polycrystalline silicon layer 23 to form an input electrode 3 and an output electrode 4 that become lower electrodes, and driver electrodes 8 [8A, 8B] on both sides of the input and output electrodes 3 and 4.

Figure 10C:
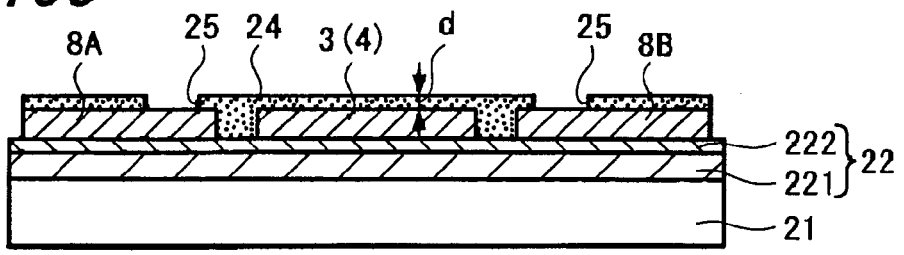

Next, as shown in FIG. 10C, a sacrifice layer 24 is formed on the surface. In this embodiment, a silicon oxide layer (SiO2 film) is formed to be the sacrifice layer 24 by the decompression CVD. Thereafter, an opening 25 is formed in the sacrifice layer 24 at a portion that becomes a support portion for an oscillation portion. Here, a thickness d of the sacrifice layer 24 formed is set to the thickness of the gap (space) between the lower electrode and the oscillation portion.

Figure 10D:
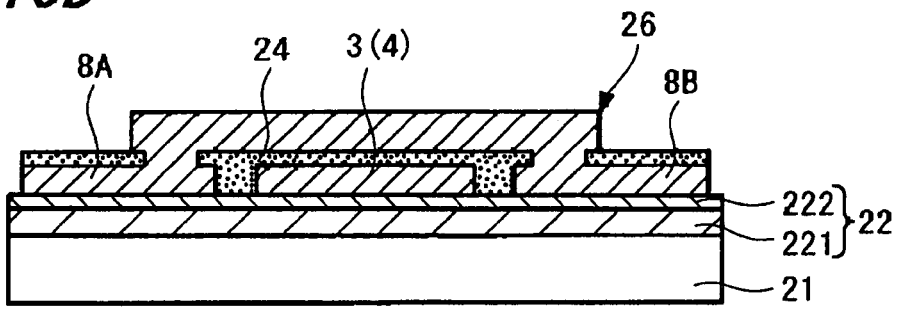

Next, as shown in FIG. 10D, a conductive film, that is, a polycrystalline silicon layer 26 doped with impurities in high concentrations in this embodiment is formed by the decompression CVD on the surface to bury the opening 25. Thereafter, patterning is performed to form the oscillation portion 6 having the constricted portions 11A and 11B (not illustrated) and the support portions 7 [7A, 7B] of the oscillation portion 6, which are connected to the driver electrodes 8 [8A, 8B].

Figure 10E:
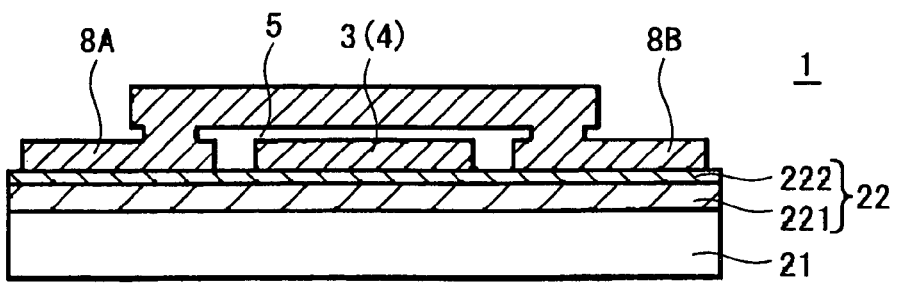

Next, as shown in FIG. 10E, the sacrifice layer 24 is selectively removed. Since the sacrifice layer 24 is formed of the silicon oxide layer in this embodiment, wet etching that uses fluoric acid is performed to remove the silicon oxide 24. Accordingly, the intended micro-resonator 1 is obtained in which the required gap (space) 5 is formed between the oscillation portion 6 and the input electrode 3 and output electrode 4 that become the lower electrodes.

According to the above-described micro-resonator 1 of this embodiment, since the constricted portions 11A and 11B are provided on both end sides of the oscillation portion 6 and the input electrode 3 and output electrode 4 are disposed to face each other on the axis line 14 perpendicular to the axis line 10 of the oscillation portion 6, a resonator in which two resonance modes of torsional oscillation and flexural oscillation are generated in a single structure and which has two different resonance frequencies can be obtained. Further, in this micro-resonator 1, each of the resonance frequencies can independently be controlled by changing the size and thickness of the oscillation portion 6.

Since the phase of the signal transmitted by the torsional oscillation differs by 180° from that of the signal transmitted by the flexural oscillation of a first-order, the micro-resonator 1 of this embodiment is capable of functioning as a band-pass filter with two resonance peaks being set close to each other. When the micro-resonator 1 is used as the band-pass filter, a signal transmission band can arbitrarily be changed by controlling the difference between two resonance frequencies. Further, a central frequency of the band-pass filter can arbitrarily be set by controlling the thickness of the oscillation portion 6.

In the above-described embodiment, a both-ends supported beam structure in which the oscillation portion of the micro-resonator is supported at both ends is employed, however, other embodiments can also be applied to other cases such as a cantilever beam structure in which an oscillation portion is supported at one end.

According to another embodiment of the present invention, the above-described micro-resonator is used to constitute a semiconductor device such as a signal filter, mixer, and a SiP (System in Package) device module and SoC (System on Chip) device module in which those filter and mixer are included.

According to an embodiment of a semiconductor device, since the above-described micro-resonator which has the two different resonance frequencies in the single structure and in which the two different resonance frequencies can independently be adjusted is used as the resonator constituting the semiconductor device, the size and occupying area of the resonator is reduced and an excellent characteristic of the resonator is obtained to provide a highly reliable semiconductor device.

The electrostatic drive micro-resonator of the above-described embodiment can be used as a band-pass filter such as a high frequency (RF) filter and an intermediate frequency (IF) filter.

According to an embodiment, a communication apparatus that uses an electromagnetic wave to perform communication, such as a mobile phone unit, a wireless LAN device, a wireless transceiver, a television tuner and a radio tuner, including the filter made of the micro-resonator of the above-described embodiment can be obtained.

Figure 11:
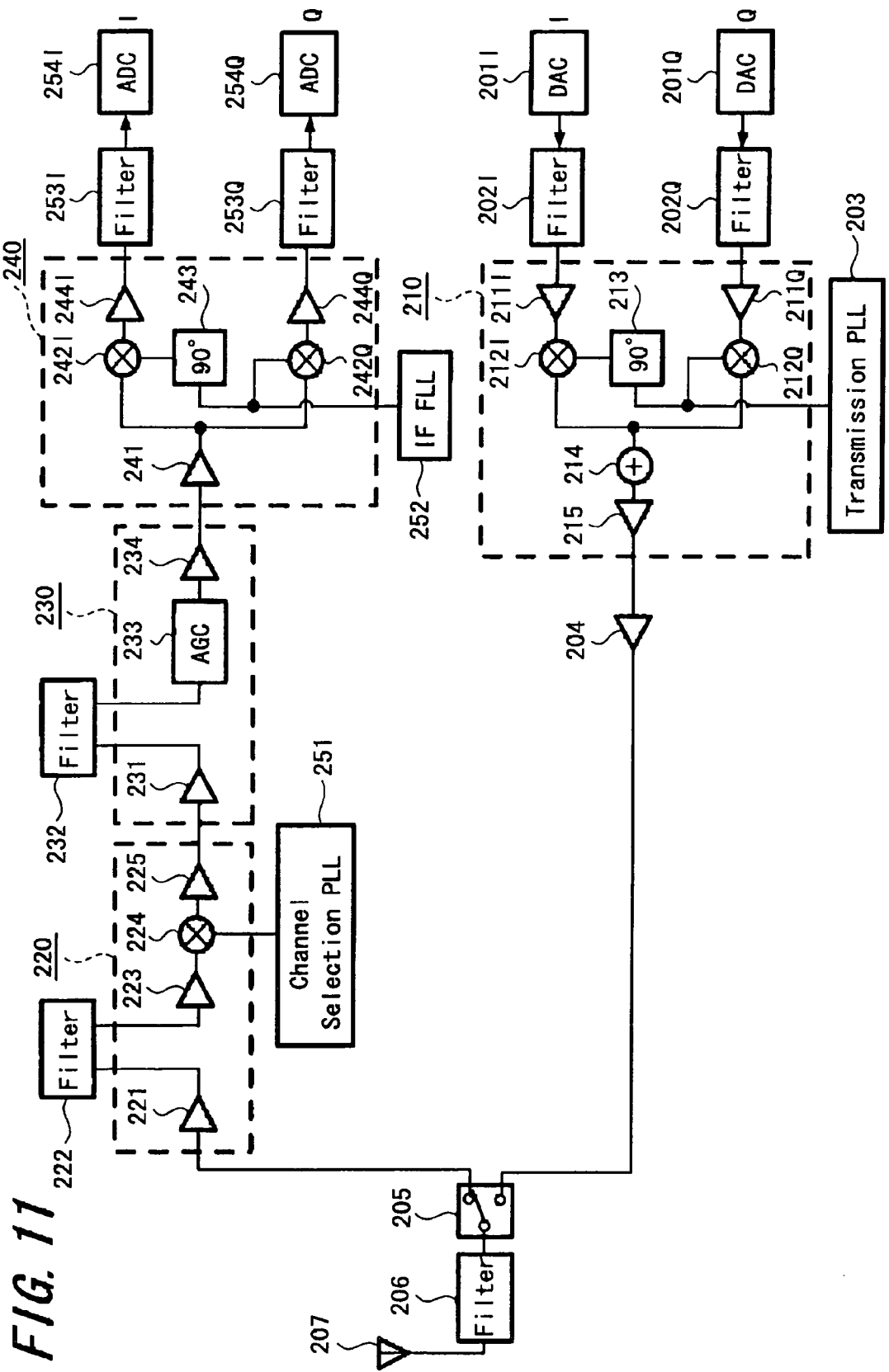
FIG. 11 is a diagram showing a configuration of a communication apparatus according to an embodiment.

Next, an example of a configuration of a communication apparatus, to which the filter of this embodiment is applied, is explained by referring to FIG. 11.

First, an explanation is made regarding a configuration of a transmission system in which transmission data of I channel and transmission data of Q channel are respectively supplied to digital/analogue converters (DAC) 201I and 201Q to be converted into analogue signals. The converted signal of each channel is supplied to band-pass filters 202I and 202Q, and outputs of the band-pass filters 202I and 202Q are supplied to a modulator 210 after a signal component other than that in a band of a transmission signal is removed.

In the modulator 210, a signal of each channel is supplied to mixers 212I and 212Q through buffer amplifiers 211I and 211Q, and is mixed with a frequency signal corresponding to a transmission frequency supplied from a transmission PLL (phase-locked loop) circuit 203 and modulated to obtain a transmission signal of one system after adding both mixed signals in an adder 214. In this case, a signal phase is shifted by 90° in a phase shifter 213 as to the frequency signal supplied to the mixer 212I such that the signal of I channel and the signal of Q channel are orthogonally modulated.

An output of the adder 214 is supplied to a power amplifier 204 through a buffer amplifier 215, and is amplified to a predetermined transmission power. The signal amplified in the power amplifier 204 is supplied to an antenna 207 through a transmission-reception switching unit 205 and high frequency filter 206, and is transmitted wirelessly from the antenna 207. The high frequency filter 206 is a band-pass filter that removes a signal component other than that in the frequency band to transmit and receive in this communication apparatus.

As a configuration of a reception system, a signal received by the antenna 207 is supplied to a high frequency unit 220 through the high frequency filter 206 and transmission-reception switching unit 205. In the high frequency unit 220, the received signal is amplified in a low noise amplifier (LNA) 221 and is thereafter supplied to a band-pass filter 222 to remove a signal component other than that in a reception frequency band, and the signal after the removal is supplied to a mixer 224 through a buffer amplifier 223. Further, a frequency signal supplied from a channel selection PLL circuit 251 is mixed to make a signal of a predetermined transmission channel into an intermediate frequency signal, and the intermediate frequency signal is supplied to an intermediate frequency circuit 230 through a buffer amplifier 225.

In the intermediate frequency circuit 230, the supplied intermediate frequency signal is supplied to a band-pass filter 232 through a buffer amplifier 231 to remove a signal component other than that in the band of the intermediate frequency signal, and the signal after the removal is supplied to an automatic gain control circuit (AGC circuit) 233 to be made into a signal of an approximately constant gain. The intermediate frequency signal whose gain is adjusted in the automatic gain control circuit 233 is supplied to a demodulator 240 through a buffer amplifier 234.

In the demodulator 240, the supplied intermediate frequency signal is supplied to mixers 242I and 242Q through a buffer amplifier 241 to be mixed with a frequency signal supplied from an intermediate frequency PLL circuit 252, and the received signal component of I channel and signal component of Q channel are demodulated. In this case, a frequency signal whose signal phase is shifted by 90° in a phase shifter 243 is supplied to the mixer 242I for I signal to demodulate the orthogonally modulated signal component of I channel and signal component of Q channel.

The demodulated signals of I channel and Q channel are respectively supplied to band-pass filters 253I and 253Q through buffer amplifiers 244I and 244Q to remove a signal component other than that of the signals of I channel and Q channel, and the signals after the removal are supplied to analogue/digital converters (ADC) 254I and 254Q to be sampled and converted into digital data, and so reception data of I channel and reception data of Q channel are obtained.

With respect to the configuration explained above, band-limiting can be performed by applying the filter having the configuration of the above-described embodiment to part of or to all of the band-pass filters 202I, 202Q, 206, 222, 232, 253I and 253Q.

According to an embodiment of the communication apparatus of the present invention, since the filter including the micro-resonator of the present invention is used as a band-pass filter, the band-pass filter is small-sized; occupying area is reduced; and an excellent characteristic of the filter is obtained to provide a highly reliable communication apparatus.

The example of FIG. 11 is the communication apparatus that performs wireless transmission and wireless reception, however, the filter according to the embodiment of the present invention can be applied to a filter included in a communication apparatus that performs transmission and reception through a wired transmission path, and furthermore can be applied to a filter included in a communication apparatus that performs only transmission processing or in a communication apparatus that performs only reception processing.

It should be understood by those skilled in the art that various modifications, combinations, sub-combinations and alterations may occur depending on design requirements and other factors insofar as they are within the scope of the appended claims or the equivalents thereof.

The invention is claimed as follows:

1. A micro-resonator of a single structure, having two similar resonance frequencies based on different resonance modes, in which output signals of said two resonance frequencies have mutually different phases by 180°; an oscillation portion including a gap and sustained by one or a plurality of support portions; and lower electrodes including an input electrode and an output electrode, said lower electrodes facing said oscillation portion across said gap, wherein said input electrode and output electrode are disposed to face each other along a line intersecting said oscillation portion, and wherein said oscillation portion generates torsional oscillation and flexural oscillation.

2. The micro-resonator according to claim 1, wherein said oscillation portion generates flexural oscillation with two support portions as nodes and generates torsional oscillation with a line connecting the two support portions as an axis.

3. The micro-resonator according to claim 2, wherein said oscillation portion has blade portions receiving electrostatic power from said lower electrodes on both sides of a portion that becomes a torsional axis on the line connecting the two support portions.

4. The micro-resonator according to claim 1, wherein said support portions, said oscillation portion, and said lower electrodes are made of polycrystalline silicon.

5. A band-pass filter comprising the micro-resonator according to claim 1.

6. A semiconductor device comprising the micro-resonator according to claim 1.

7. A communication apparatus having a filter to limit the band of a transmission signal and/or a reception signal, wherein said filter including a micro-resonator according to claim 1 as said filter.

* * * * *